United States Patent
Haerle et al.

(10) Patent No.: US 6,296,716 B1
(45) Date of Patent: Oct. 2, 2001

(54) PROCESS FOR CLEANING CERAMIC ARTICLES

(75) Inventors: Andrew G. Haerle, Northboro, MA (US); Gerald S. Meder, Phoenix, AZ (US)

(73) Assignee: Saint-Gobain Ceramics and Plastics, Inc., Worcester, MA (US)

( * ) Notice: Subject to any disclaimer, the term of this patent is extended or adjusted under 35 U.S.C. 154(b) by 0 days.

(21) Appl. No.: 09/470,510

(22) Filed: Dec. 22, 1999

Related U.S. Application Data

(60) Provisional application No. 60/157,400, filed on Oct. 1, 1999, and provisional application No. 60/159,806, filed on Oct. 15, 1999.

(51) Int. Cl.[7] ..................................................... B08B 3/00
(52) U.S. Cl. ...................... 134/7; 134/2; 134/3; 134/6; 134/28; 134/26; 134/34; 134/36; 134/41; 134/42; 134/902; 451/38; 451/39; 451/75; 451/102
(58) Field of Search .................................. 134/2, 3, 6, 7, 134/28, 26, 34, 36, 41, 42, 902; 451/38, 39, 75, 102

(56) References Cited

U.S. PATENT DOCUMENTS

| | | | |
|---|---|---|---|
| 3,951,587 | 4/1976 | Alliegro et al. | 432/253 |
| 4,707,951 | 11/1987 | Gibot et al. | 51/410 |
| 5,041,229 | * 8/1991 | Brock et al. | 252/79.1 |
| 5,294,261 | * 3/1994 | McDermott et al. | 134/7 |
| 5,378,312 | * 1/1995 | Gifford et al. | 156/643 |
| 5,719,062 | 2/1998 | Kinisky | 436/183 |
| 5,792,275 | * 8/1998 | Natzle et al. | 134/7 |
| 5,931,721 | * 8/1999 | Rose et al. | 451/89 |
| 5,967,156 | * 10/1999 | Rose et al. | 134/7 |
| 6,004,400 | 12/1999 | Bishop et al. | 134/2 |

FOREIGN PATENT DOCUMENTS

| | | | |
|---|---|---|---|
| 533438A2 | 3/1993 | (EP) . | |
| 0 738 697 A1 | 10/1996 | (EP) | C04B/35/111 |
| 2130192A | 5/1984 | (GB) . | |
| 60075587 | 4/1985 | (JP) . | |
| 04280888 | 10/1992 | (JP) . | |
| WO 01/25167 | * 4/2001 | (WO) . | |

OTHER PUBLICATIONS

Stuart A. Hoenig, Kevin W. Kinkade; Use of Dry Ice And Various Solvents For Removing Flux–Contaminants From Printed Circuit Boards; Proceedings of the International Symposium On Microelectronics (SPIE vol. 1847), San Francisco, CA Oct. 19–21, 1992; pp. 29–34.

Robert Sherman, Drew Hirt, and Ronald Vane; Surface Cleaning With The Carbon Dioxide Snow Jet; Journal of VAcuum Science and Technology: Part A, US American Institute of Physics, New York, vol. 12, No. 4, Part 02, Jul. 1, 1994, pp. 1876–1881.

* cited by examiner

*Primary Examiner*—Sharidan Carrillo
(74) *Attorney, Agent, or Firm*—Mike W. Crosby

(57) ABSTRACT

A method for cleaning ceramic workpieces such as SiC boats used in semiconductor fabrication is disclosed. The method comprises washing a virgin or used ceramic workpiece with a strong acid and then using a pelleted $CO_2$ cleaning process on the acid-washed component. The inventive method has been found to produce a workpiece having a very low level of metallic and particulate contaminants on its surface.

15 Claims, No Drawings

PROCESS FOR CLEANING CERAMIC ARTICLES

CROSS REFERENCE TO RELATED APPLICATIONS

The present application claims the benefit of U.S. Provisional Patent Application Serial No. 60/157,400—filed Oct. 1, 1999, and U.S. Provisional Patent Application Serial No. 60/159,806 filed Oct. 15, 1999.

FIELD OF THE INVENTION

The present invention relates to methods for cleaning ceramic articles. More particularly, the present invention relates to method for removing both particle impurities and chemical impurities from ceramic articles used in the manufacture of semiconductor devices.

BACKGROUND OF THE INVENTION

The manufacture of semiconductor devices typically requires subjecting the surface of a silicon wafer to high temperature processes such as diffusion, oxidation and deposition. In deposition processes, dielectric materials such as polycrystalline silicon, silicon nitride and silicon dioxide are deposited on the surface of the wafer. In diffusion processes, materials are diffused into the body of the silicon wafer. In oxidation processes, the surface of the wafer is oxidized to form a thin silica layer. Each of these processes typically involves placing the wafers to be processed in a holder, often called a "boat". The boat is typically formed of a ceramic material and is configured to hold the wafer in either a horizontal or a vertical orientation. Once loaded with wafers to be processed, the boat is placed in an electrically-heated furnace or process tube, and then the environment inside the tube is altered to provide various atmospheres having temperatures typically ranging from 250° C. To over 1200° C.

Another common semiconductor process is etching. After a photolithographic pattern is deposited on the surface of a silicon wafer, the wafer is loaded into an etcher. The etcher, whose components are typically made of a ceramic material, uses a plasma etching process to remove the materials deposited on the wafer surface which are not protected by a photolithographic pattern. The typical etching process removes oxides, metals and/or polymers from the wafer surface.

Although each of the processes described above successfully develops the surface of the silicon wafer into a useable product, they also eventually contaminate the surfaces of the supporting equipment as well. For example, a nitride deposition process will leave a coating of silicon nitride upon not only the wafer, but also upon the surface of the boat which supported the wafer during the deposition process. When this coating becomes too thick, it tends to flake and contaminate nearby wafers with particles.

In an etching process, the deliberate removal of various layers of material from the wafer-in-process can cause contaminant particles such as silica, nitrides, and alumina to be deposited on the surface of etcher components. Since contaminants adversely affect the processing of future wafers to be processed by these components, contaminant particles must be carefully cleaned from the surfaces of these components. Because of the decreasing line widths of silicon wafers, it has become increasingly important to remove more sub-micron particles from the surface of these components, more particularly sub-micron particles having a width of no more than 0.7 microns.

Several methods for cleaning used ceramic boats are known in the prior art. In one method, a used component which is coated with a deposited material such as silicon nitride, polysilicon or silica undergoes a two-step cleaning process whereby the component is first exposed to a stream of hard pellets, such as silicon carbide pellets, in a process akin to sandblasting, and then to a stream of frozen carbon dioxide ($CO_2$) pellets. The first step, termed preliminary cleaning, successfully strips deposited material from the component surface, leaving behind some debris particles on the order of one micron. In the second step, termed primary cleaning, the frozen $CO_2$ pellets are believed to cause the micro-sized debris particles to freeze, thereby becoming brittle, and then break, thereby allowing them to be easily flushed from the surface.

Preliminary cleaning is ordinarily carried out either by impinging or "blasting" glass, aluminum oxide, silicon carbide, titanium oxide, walnut shell particles, or other hard beads against the part being cleaned. The beads are typically carried in a pressurized stream of air or other gas. The beads can be spherical, granular, or any other desired shape and dimension. One commonly used bead material is 98% black SiC grit. The pressure under which the beads are directed to the surface depends on the composition of the part being cleaned. When a ceramic part is to be cleaned, the beads typically are applied in a gas at a pressure in the range of about 20–35 psi. Once completed, the bead blasting, preliminary cleaning, step is followed by a $CO_2$ cleaning process. $CO_2$ cleaning processes have been described in the patent literature. See, for example, U.S. Pat. No. 4,707,951, entitled "Installation for the Projection of Particles of Dry Ice".

In another method of cleaning a used boat which is coated with deposition layers, one manufacturer recommends subjecting the used boat to an acid treatment, preferably using a strong acid such as HF, followed by baking. This HF treatment removes the deposited layer of material.

The cleanliness of virgin semiconductor processing equipment has also been a concern in the art. However, for a virgin part, the concern has typically been metallic, rather than particulate, contamination. In one conventional method of manufacturing SiC diffusion components, the virgin SiC diffusion components are subjected to a weak acid and then baked. This process serves to remove some metallic contaminants and fingerprints from the part being cleaned.

In another conventional method of insuring the cleanliness of virgin components, the component is subjected to a strong acid such as HF prior to installing it in a furnace. Similarly, hot HCl cleaning has been used in connection with semiconductor diffusion components. For example, in UK Patent Application No. GB 2,130,192, the investigators disclose a manufacturing step of subjecting a virgin SiC component to hot HCl treatments prior to use in a semiconductor furnace.

In some cases, HF treatment by itself has been considered sufficient for cleaning both virgin boats (to reduce metallic contamination) and used boats (to chemically strip coatings deposited during semiconductor processing). That notwithstanding, the use of HF alone fails to remove problematic debris particles that may still be present after such treatment.

In sum, conventional methods of providing a clean virgin semiconductor component involve acid cleaning to remove metallic contamination, while conventional methods of cleaning used components involve either i) a two-step process of mechanical stripping of deposited coats via bead blasting followed by $CO_2$ cleaning to remove small debris particles, or ii) hot strong acid cleaning to remove a coat of deposited material.

SUMMARY OF THE INVENTION

The fabrication of semiconductor devices requires the use of process components having a high level of surface purity, whether those components are new or reconditioned. In certain workpieces, such as ceramic boats used to position and maintain semiconductor wafers during processing, the long depth and narrow spacing of the wafer-retaining slots define a boat geometry with a contoured surface having an aspect ratio that prevents bead blasting from sufficiently stripping coatings from the deeper portions of these slots. In particular, aspect ratios, (i.e., the ratio of slot depth to slot width), of greater than about 4:1 are typically beyond the ability of conventional cleaning methods. The present invention presents a method for overcoming this and other shortcomings by providing a process in which the inorganic surface of semiconductor fabrication components is cleaned by chemical stripping followed by $CO_2$ cleaning. In one embodiment, the chemical stripping is carried out using a solvent containing a strong acid. In a more preferred embodiment, the chemical stripping is carried out using a solvent having at least 1 v/o of an acid selected from the group consisting of HF, acids having a pKa of less than about one, and mixtures thereof. As used herein, "v/o" represents a volume percent, and "strong acid" represents a solution having at least 1 v/o of an acid having a pKa of less than about one.

The $CO_2$ cleaning step employs particles of dry ice which are projected against the surface being cleaned. The combination of the chemical stripping and the $CO_2$ cleaning step has been found to successfully remove both particulate and metallic contaminants from the surface of the workpiece.

Workpieces cleaned using the inventive process have been found to have a surface contaminant particle density of no more than about 0.4 particles, and preferably no more than about 0.2 particles, larger than about 0.3 $\mu$m per square centimeter. Such workpieces have also been found to have a surface metallic contaminant concentration of no more than about 600 ppm, as measured by SIMS at a depth of about 10 nm. Of the surface metallic contamination, no more than about 400 ppm of metal contaminants other than alkaline and alkaline earth metals, and no more than about 225 ppm of iron, (as measured by SIMS at a depth of about 10 nm), remain following application of the inventive cleaning process to typical workpieces.

The present invention is based upon the recognition that problematic debris particles may still be present after HF treatment, and that $CO_2$ cleaning steps, while removing particulate contaminants, are unable to remove non-particulate metallic contaminants. To date, the art has lacked any suggestion of the present invention which employs HF treatment to remove metallics followed by a $CO_2$ cleaning step to remove any remaining debris particles. Combining a $CO_2$ cleaning step with HF treatment is unique in that $CO_2$ cleaning has traditionally been used only after a used workpiece underwent mechanical stripping which produced debris particles.

The present invention also relates to workpieces, such as ceramic boats used in semiconductor processing, that have been cleaned using the process of the present invention. The resulting workpieces are unique in that their level of metallic and particulate surface contamination is significantly below that which has previously been obtainable using processes known to those skilled in the art.

DETAILED DESCRIPTION OF THE INVENTION

The present invention provides a process for providing ceramic workpieces, such a ceramic boats used in semiconductor fabrication with a lower level of metallic and particulate surface contamination than has previously been available. Specifically, whereas it is known in the art to use acid cleaning, and whereas it is also known in the art to use bead-blast cleaning in combination with $CO_2$ cleaning, to date, there has been no suggestion in the art to combine an acid cleaning step with a $CO_2$ cleaning step for cleaning either virgin or used, coated ceramic workpieces. The recognition that an acid cleaning step can be combined with a $CO_2$ cleaning step yields a cleaning process that is well-suited for use with both virgin and used, coated workpieces.

As noted above, use of the inventive process has provided workpieces having a surface contaminant particle density of no more than about 0.4 particles larger than about 0.3 $\mu$m per square centimeter, and a surface metallic contaminant concentration of no more than about 600 ppm, as measured by SIMS at a depth of about 10 nm. Traditionally, upon receiving a virgin workpiece such as a ceramic boat from a manufacturer, the user would subject the workpiece to an acid cleaning process in order to remove any metallic contaminants that may have deposited on the workpiece during manufacture, packaging, shipping, etc. In some instances, used, coated workpieces would be cleaned by chemical stripping using a strong acid. As with the virgin workpieces, the acid cleaning provided a satisfactory means for removing metallic contaminants form the surface of the workpiece.

Although acid cleaning provides a surface having metallic contaminants lowered to satisfactory levels, the process fails to provide a surface having a sufficiently low level of particulate contamination. In fact, some evidence exists that the acid cleaning step actually contributes to particulate contamination. Without wishing to be tied to any particular theory, in cleaning a workpiece such as a used ceramic boat, workpieces cleaned using HF to chemically strip a coating still have a high level of particulate contamination because the stripping process leaves particulate contaminants on the ceramic surface.

Furthermore, particulate contamination does not result solely from the acid cleaning process and post-processing steps. Rather, in the case of virgin workpieces, it is believed that machining the component, such as an SiC boat, produces particles which deposit upon the surface of the component. Of course, particles also may deposit upon a virgin component because of exposure of such components to non-clean-room environments. It should be noted that, in the case of either virgin or used components, and pre-processing, processing or post-processing steps, many mechanisms for the formation of particles on the workpiece may exist, and the present invention is not intended to be limited to any particular particle formation or deposition mechanism. As noted previously, $CO_2$ cleaning procedures have traditionally been used in combination with a preliminary cleaning step such as bead-blasting. The combination of bead-blasting and COcleaning has generally not been used on virgin workpieces, but rather, has been employed on used workpieces that have had CVD coatings deposited on their surfaces during semiconductor processing. While this method has been found to be satisfactory for the, removal of particulate contaminants, it lacks the ability to remove metallic contamination that occurs on both virgin and used workpieces.

The present invention recognizes that until the workpiece, be it a virgin component or a chemically-stripped component, is subjected to a final $CO_2$ cleaning step, problematic submicron particles which need to be eliminated from the surface of the components will remain. The need for removal of such particulate contaminants, as well as the manner in which such removal is achieved is neither appreciated nor performed in conventional processes.

Moreover, it appears that products resulting from the inventive process also possess superior levels of metallic purity as compared to re-worked products processed by cleaning methods which use $CO_2$ cleaning to clean the used coated workpieces. As noted above, one conventional process mechanically strips the coating from a used component, such as a boat, via bead blasting, and then uses $CO_2$ cleaning to complete the cleaning. Without wishing to be tied to any particular theory, in the case of a used boat, the conventional understanding is that surface metallic contamination is not a problem. Conversely, even if surface metallic contamination did give rise to problems, it was wrongly assumed that such problems could be sufficiently eliminated using techniques known in the prior art. In contrast, some evidence suggests that a bead blasting step actually acts to increase the concentration of metallic impurities at the surface of the workpiece. This undesirable effect may be the result of the use of impure blasting media The process of the present invention is superior to the conventional bead blasting/$CO_2$ cleaning process in that it does not result in metallic contamination of the surface of the stripped workpiece. In fact, the present inventive process acts to reduce the concentration of metals at the surface.

Likewise, for a virgin workpiece, such as an unused SiC boat, the conventional understanding of surface metallic impurity has been that HF or hot HCl cleaning offered only marginal utility because it served only to incrementally reduce the concentration of metals at the surface of the component to a level slightly below that of the bulk material forming the workpiece (1–10 ppm for SiC), and that this relative purity advantage over the bulk disappeared over time as subsequent use under high temperature environments promoted the diffusion of bulk metals into the surface region of the component. Accordingly, the art did not require HF cleaning in all circumstances.

The surface of materials representing virgin SiC components has been analyzed by one conventional method (x-ray photoelectron spectroscopy, referred to herein as XPS) and by another method (secondary ion mass spectroscopy, referred to herein as SIMS). A conventional XPS analysis provides information at a depth of about 3 nm and has a sensitivity of about 0.1–1.0% depending upon the element of interest. In contrast, the SIMS analysis can provide information at a depth of about 10 nm and has a sensitivity of about 0.2–3.0 ppm. For this reason, the SIMS test provides a more accurate method for measuring the surface concentration of metals in semiconductor processing components. It has been found that in instances where XPS failed to detect any metals, (and thus failed to provide any indication of an elevated surface metals concentration), the SIMS test reported about 2000 ppm metals at a depth of 10 nm. In the field of high temperature semiconductor processing, these surface levels are clearly undesirable. Accordingly, as a result of the SIMS analysis, there is now a demonstrated need to clean the surface of a virgin ceramic component, preferably using a strong acid solution, in order to reduce the high surface level of metallic contaminants present at the surface of semiconductor processing components. It should be appreciated that, in one embodiment of the present invention, the surface is a CVD surface, which optionally may have been subjected to machining or other post-processing steps.

More particularly, it should be understood that the process of the present invention is intended to be applied to a wide variety of inorganic surfaces employed by semiconductor processing components. Such surfaces typically comprise ceramic materials such as those ceramics commonly used in semiconductor fabrication, however, the process may be applied to non-ceramic surfaces such as silicon and diamond as well. Thus, while the discussion has focussed primarily on semiconductor processing components such as ceramic boats, and particularly those formed of SiC, it should be understood that the invention is not intended to be limited in this manner. Rather, the invention is intended to apply to any of the semiconductor processing components that have inorganic surfaces associated with semiconductor wafer processing techniques. These surfaces include, but are not limited to silicon (Si), silicon carbide (SiC), silicon nitride ($Si_3N_4$), diamond, yttria ($Y_2O_3$), zirconia ($ZrO_2$), aluminum nitride (AlN), aluminum oxide ($Al_2O_3$) and quartz.

The surfaces may be vapor-deposited, and as discussed above may be deposited using CVD techniques. Such surfaces include, but are not limited to polycrystalline or other CVD Si, CVD SiC, CVD $SiO_2$, CVD $Si_3N_4$ and CVD diamond surfaces. Of course, it should be understood that despite the applicability of the present invention to surfaces having inorganic coatings thereon, the process may also be applied to uncoated, inorganic surfaces.

In considering SiC workpieces, several varieties are used in the art. In one embodiment, a workpiece formed simply of SiC is used. In another embodiment, the workpiece comprises a reduced porosity SiC formed by loading the pores of a SiC structure with Si. Because the silicon tends to escape from the pores, such workpieces are often provided with a CVD SiC layer. More specifically, these components typically are formed of a porous $\alpha$-SiC body having Si occupying the pores. To prevent the Si from escaping, a layer of very pure $\beta$-SiC is deposited on the surface of the component using CVD methods. The $\beta$-SiC is intended to seal the surface and inhibit loss of Si near the surface of the workpiece.

It should be understood that the $\beta$-SiC material deposited on the workpiece to prevent Si from escaping is not intended to be removed by the process of the present invention. Rather, when referring herein to the removal of coatings from used workpieces, the subject coatings are those that have been deposited on the workpiece during its use in semiconductor processing. Thus, a virgin coated workpiece refers to a newly manufactured workpiece having a desired coating formed thereon, while a used, coated workpiece refers to a workpiece having an undesired coating deposited during semiconductor processing. Of course, upon use, the virgin coated workpiece acquires an additional, undesired coating, and it is the removal of the coating which forms one embodiment of the present invention.

While useful with vertical racks, it should be understood that the process of the present invention employing a strong acid clean followed by a $CO_2$ clean provides unexpected benefits not only for vertical racks, but also for semiconductor processing equipment of any shape. Examples of semiconductor processing components used in single wafer processing to which the present invention may be applied include, but are not limited to, bell jars, electrostatic chucks, focus rings, shadow rings, chambers, susceptors, lift pins, domes, end effectors, liners, supports, injector ports, manometer ports, wafer insert passages, screen plates, heaters, and vacuum chucks. Examples of semiconductor processing components used in batch processing to which the present invention may be applied include, but are not limited to, paddles, process tubes, wafer boats, liners, pedestals, long boats, and dummy wafers. Examples of semiconductor processing components used in chemical mechanical polishing (CMP) to which the present invention may be applied include, but are not limited to, conditioning pads and wafer holders.

Lastly, it is believed that the process of the present invention provides for the first time a ready-to-install product, that is, a product that can be safely taken out of a protective shipping bag at the user's facility and directly installed in a semiconductor furnace without any further cleaning by the user. This is achievable because such components already have the lowest possible amounts of surface metals and particles achievable by surface treatments.

More particularly, in one aspect of the present invention, immediately upon completing the $CO_2$ cleaning step, the cleaned workpiece is installed either into a furnace used for processing semiconductor wafers, or into a bag used for the shipping and storage of cleaned semiconductor processing components. In the former process, the workpiece is transferred directly from $CO_2$ cleaning into the furnace without any further cleaning steps. In the latter process, the workpiece is packaged, i.e., bagged, directly following $CO_2$ cleaning without any further cleaning steps. In this latter case, upon removing the workpiece from its packaging, it is installed directly into a furnace used for processing semiconductor wafers without any further cleaning steps. Unlike processes known in the art in which it is necessary to provide additional cleaning steps between removal of the workpiece from its packaging and installation in the furnace, components cleaned using the method of the present invention may be installed into the furnace immediately upon removal from their packaging. This is advantageous in that it eliminates additional processing steps which can, among other things, actually lead to increased levels of contamination, particularly particulate contamination.

Although several prior art cleaning regimes, and their advantages and disadvantages, have been described previously herein, none of those known in the art offer the ability to provide a surface having the low contamination level of metallics and particles available from the inventive process described herein. Washing in a strong acid solution, such as a solution containing HF or other acid having a pKa of less than about one, provides a surface having unsatisfactory levels of particulate contaminants. Alternatively, washing in a weak acid solution or bead-blasting followed by a $CO_2$ cleaning results in less desirable levels of metallic contaminants. It was not until the present invention, in which a strong acid cleaning is followed by $CO_2$ cleaning, that one could achieve acceptable levels of both metallic and particulate contamination.

In another embodiment of the present invention, the acid cleaning and $CO_2$ cleaning steps are coupled with a modified bead blasting step. Specifically, in this embodiment, the invention includes the steps of bead-blasting the surface of the workpiece using green SiC particles. Subsequently, the surface is contacted with a solvent having at least 1 v/o of an acid selected from the group consisting of HF, acids having a pKa of less than about one, and mixtures thereof. The surface is then treated using $CO_2$ cleaning. The use of green SiC in the bead-blasting step is unique in that, to date, only black SiC has been used for bead-blasting purposes. In the present invention it has been found that bead-blasting using green SiC beads provides surfaces that are significantly lower in contaminants. This is believed to be the result of the composition of the black SiC beads versus the green SiC beads. Whereas the former comprise a grit containing about 98% SiC, (and an impurity level of about 2%), the latter contain impurities in the range of approximately 1000–2000 parts per million, (i.e., 0.1–0.2% impurities).

In still another embodiment of the present invention, the strong acid step can be eliminated entirely and replaced with a bead blasting step using green SiC beads described above. Thus, the process employs the steps of bead-blasting with green SiC followed by a $CO_2$ cleaning.

In yet another embodiment, the use of an acid cleaning step can be eliminated when cleaning certain components. Specifically, as noted above, certain workpieces may be provided with coatings. Such coatings may be provided by any of a wide variety of processes including chemical vapor deposition, sputter deposition and spray coating. For example, a workpiece formed of α-SiC may be provided with a CVD deposited β-SiC coating to form a very pure surface. Likewise, thick CVD deposited SiC films of up to about 500 microns in thickness usually do not require additional machining steps, and thus avoid one significant source of metallic contamination. Alternatively, workpieces formed from other ceramic materials may be such that they do not require certain processing steps, such as sandblasting, that introduce metallic impurities onto the ceramic surface. These workpieces also have surfaces that are low in metallic contaminants. New workpieces having such coated or otherwise pure surfaces are relatively free of metallic contaminants. Of course, any of the surfaces described above will include some low level of unavoidable metallic impurities, however, such impurity levels are significantly lower than those introduced by machining steps such as sandblasting. As such, these workpieces can be cleaned using only the $CO_2$ process and installed directly into a furnace or immediately packaged without any additional cleaning steps. Likewise, the packaged workpieces of this type can be removed from their packaging and directly installed into a furnace without any additional cleaning steps. Thus, although the prior art includes processes in which the $CO_2$ process is used without an acid cleaning step, none of these processes are used in connection with virgin workpieces of the type described above. By eliminating the acid cleaning step for certain virgin workpieces, cleaning time and process complexity can be minimized.

It is noted that in each of the embodiments employing green SiC described above, the $CO_2$ cleaning step may employ techniques and apparatus that are known in the art. One example of a satisfactory $CO_2$ method and delivery system is that described in U.S. patent application Ser. No. 08/890,116, entitled "Carbon Dioxide Cleaning Process", the teachings of which are incorporated herein by reference.

Further improvements include the use of high purity $CO_2$ in the $CO_2$ cleaning step and the application of the present process, to the extent possible, in a clean-room environment. Needless to say, any reduction in impurities in the environment surrounding the workpiece during or after cleaning will result, ultimately, in a cleaner workpiece.

EXAMPLES

Results are presented below for several tests of the steps used in the inventive process. In Table 1, CVD SiC coated parts that had been subjected to machining (i.e., wet or dry sandblasting) were analyzed for metallic impurities. These samples were measured either directly after the sandblasting, after a post-sandblasting weak acid treatment, or after the samples had been subjected to the inventive process ($HF/CO_2$) post-sandblasting. The ability of the inventive process to provide improved metal removal, particularly for iron can be seen in the Table.

TABLE 1

Metallic Impurities in Parts Per Million

| PROCESS | Na | Al | Ti | V | Cr | Fe | Ni |
|---|---|---|---|---|---|---|---|
| WS | 6 | 54 | 3 | 0.5 | 14 | 115 | 2 |
| WS weak acid | 6 | 33 | 1 | 0.1 | 8 | 38 | 0.8 |
| WS Invention | 2 | 17 | 1 | 0.05 | 6 | 28 | 2 |
| DS | 136 | 98 | 60 | 10 | 4 | 1441 | 18 |
| DS weak acid | 132 | 60 | 39 | 7 | 3 | 381 | 8 |
| DS Invention | 7 | 107 | 20 | 3 | 4 | 211 | 4 |

WS = Wet Sandblast
DS = Dry Sandblast

Results from SIMS approximately 10 nm below surface.

Table 2 presents particulate impurity data for non-machined samples that do not have CVD coated surfaces. Samples 1–6 were treated with conventional workpiece cleaning steps, and samples 7–10 were cleaned using the process of the present invention. The numbers of particulate impurities are presented for two sides of each sample.

TABLE 2

Particulate Impurities I

| Sample | Process | Side 1 | Side 2 |
|---|---|---|---|
| 1 | Conventional | 0.98 | 1.12 |
| 2 | Conventional | 0.8 | 0.67 |
| 3 | Conventional | 0.77 | 0.78 |
| 4 | Conventional | 0.99 | 0.86 |
| 5 | Conventional | 1.34 | 1.23 |
| 6 | Conventional | 0.79 | 0.86 |
| 7 | $CO_2$ | 0.03 | 0.17 |
| 8 | $CO_2$ | 0.14 | 0.12 |
| 9 | $CO_2$ | 0.05 | 0.03 |
| 10 | $CO_2$ | 0.04 | 0.12 |

Table presents particulate impurity data for samples before and after treatment with the $CO_2$ process described above. In samples A, B and C, the sample is machined SiC that does not have a CVD coating on its surface. Sample D is a non-machined sample having a CVD SiC surface. As can be seen, the use of the $CO_2$ process significantly reduces the amount of particulate contaminants.

TABLE 3

Particulate Impurities II

| Sample | Particles Before | Particles After |
|---|---|---|
| A | 0.35 | 0.04 |
| B | 0.54 | 0.13 |
| C | 0.55 | 0.09 |
| D | 0.65 | 0.01 |

EQUIVALENTS

From the foregoing detailed description of the specific embodiments of the invention, it should be apparent that a novel system for removing metallic and particulate contaminants from ceramic workpieces has been described. Although particular embodiments have been disclosed herein in detail, this has been done by way of example for purposes of illustration only, and is not intended to be limiting with respect to the scope of the appended claims which follow. In particular, it is contemplated by the inventors that various substitutions, alterations, and modifications may be made to the invention without departing from the spirit and scope of the invention as defined by the claims.

We claim:

1. A process for cleaning a semiconductor processing component having an inorganic surface, the process comprising the steps of:
    a) exposing the inorganic surface to a solvent having at least 1 v/o of an acid selected from the group consisting of HF, acids having a pKa of less than about one, and mixtures thereof, and
    b) directing a flow of frozen $CO_2$ pellets upon the surface, wherein after steps a) and b) are performed the inorganic surface has a metallic contaminant concentration of at most about 600 ppm, as measured by SIMS at a depth of about 10 nm.

2. The process of claim 1, wherein the metallic contaminant concentration other than alkaline and alkaline earth metals is at most about 400 ppn, as measured by SIMS at a depth of about 10 nm.

3. The process of claim 1, wherein the metallic contaminant concentration of iron is at most about 225 ppm, as measured by SIMS at a depth of about 10 nm.

4. The process of claim 1, wherein after the flow of frozen $CO_2$ pellets is directed onto the surface, the component is installed in a furnace used for processing semiconductor wafers.

5. The process of claim 1, wherein after the flow of frozen $CO_2$ pellets is directed onto the surface, the component is sealed in a package suitable for storage and transport.

6. The process of claim 1, wherein prior to the step of exposing the inorganic surface to the solvent the component is subjecting to blasting with green SiC particles.

7. The process of claim 1, wherein the inorganic surface is selected from the group consisting of Si, diamond, $Y_2O_3$, $ZrO_2$, SiC, $Si_3N_4$, AlN, $Al_2O_3$ and quartz.

8. The process of claim 1, wherein the inorganic surface has a vapor-deposited coating thereon.

9. The process of claim 1, wherein the surface is a vapor-deposited material selected from the group consisting of CVD Si, CVD $SiO_2$, CVD SiC, CVD $Si_3N_4$, CVD diamond, $Y_2O_3$ and $ZrO_2$.

10. The process of claim 1, wherein the inorganic surface comprises a coating provided by sputter deposition or spray coating.

11. The process of claim 4, wherein no additional cleaning steps are carried out between completing the flow of frozen $CO_2$ pellets and installing the component in the furnace.

12. The process of claim 5, wherein no additional cleaning steps are carried out between completing the flow of frozen $CO_2$ pellets and packaging the component.

13. A process as in claim 5 which includes the further steps of removing the component from the package and installing the component into a furnace used for processing semiconductor wafers.

14. A process as in claim 13 wherein no additional cleaning steps are carried out between removing the component from the package and installing it into the furnace.

15. A process for cleaning a semiconductor processing component having an inorganic surface, the process comprising the steps of:
    a) subjecting the component to blasting with green SiC particles;
    b) exposing the inorganic surface to a solvent having at least 1 v/o of an acid selected from the group consisting of HF, acids having a pKa of less than about one, and mixtures thereof; and
    c) predicting a flow of frozen $CO_2$ pellets upon the surface.

* * * * *